United States Patent
Eibl

(10) Patent No.: US 11,821,941 B2
(45) Date of Patent: Nov. 21, 2023

(54) METHOD FOR OPEN-LOOP OR CLOSED-LOOP CONTROL OF THE TEMPERATURE OF A CHUCK FOR A WAFER, TEMPERATURE ADJUSTMENT DEVICE, AND WAFER TESTING SYSTEM

(71) Applicant: ATT Advanced Temperature Test Systems GmbH, Planegg (DE)

(72) Inventor: Markus Eibl, Planegg (DE)

(73) Assignee: ATT ADVANCED TEMPERATURE TEST SYSTEM GMBH, Planegg (DE)

( * ) Notice: Subject to any disclaimer, the term of this patent is extended or adjusted under 35 U.S.C. 154(b) by 0 days.

(21) Appl. No.: 17/629,071

(22) PCT Filed: Jul. 21, 2020

(86) PCT No.: PCT/EP2020/070514
§ 371 (c)(1),
(2) Date: Feb. 15, 2022

(87) PCT Pub. No.: WO2021/013819
PCT Pub. Date: Jan. 28, 2021

(65) Prior Publication Data
US 2022/0334174 A1   Oct. 20, 2022

(30) Foreign Application Priority Data
Jul. 22, 2019   (DE) ..................... 10 2019 005 093.2

(51) Int. Cl.
*G01R 31/28*   (2006.01)

(52) U.S. Cl.
CPC ...... *G01R 31/2874* (2013.01); *G01R 31/2865* (2013.01)

(58) Field of Classification Search
CPC ............ G01R 31/2831; G01R 31/2865; G01R 31/2874; G01R 31/2887; G01R 31/2867;
(Continued)

(56) References Cited

U.S. PATENT DOCUMENTS

| | | | |
|---|---|---|---|
| 5,001,423 A | 3/1991 | Abrami et al. | |
| 5,111,421 A * | 5/1992 | Molnar | G06F 7/485 708/505 |

(Continued)

OTHER PUBLICATIONS

International Search Report dated Jul. 21, 2020.

*Primary Examiner* — Vinh P Nguyen
(74) *Attorney, Agent, or Firm* — Gerald E Hespos; Michae J Porco

(57) ABSTRACT

A method for open-loop or closed-loop control of the temperature of a chuck for a wafer includes detecting the position of a test device for testing a wafer and determining the spatial distances between the test device and a plurality of temperature measurement devices for measuring the temperature of the chuck or of a wafer supported or clamped by the chuck. The method proceeds by selecting at least one temperature measurement device from the plurality of temperature measurement devices as a reference temperature measurement device; and controlling the temperature of the chuck by open-loop or closed-loop control on the basis of the temperature(s) of the chuck or wafer as measured by the selected one or more reference temperature measurement devices.

16 Claims, 4 Drawing Sheets

(58) Field of Classification Search
CPC ............ G01R 31/2851; G01R 31/2868; G01R
1/0408; G01R 31/2862; G01R 31/2863;
G01R 31/2889; G01R 31/2872; G01R
31/2877; G01R 31/2849; G01R 31/2806;
G01R 31/00; G01R 31/002; G01R 31/26;
G01R 31/2642; G01R 31/2834; G01R
31/2855; G01R 31/2881; G01R 31/275;
G01R 31/28; G01R 31/54; G01R
31/2808; G01R 35/00; G01R 35/005;
H01L 21/67103; H01L 21/67248; H01L
21/687; H01L 22/00; H01L 21/67178;
H01L 21/67098; H01L 21/6831; H01L
21/68; B23Q 11/127; F95B 29/028; F28D
2021/0077; F28D 15/00; F28D 20/02;
F28D 9/00; G01K 1/14; G01K 11/20;
G01K 13/02; G01K 15/005; G01K 11/00;
F28F 27/00
See application file for complete search history.

(56) References Cited

U.S. PATENT DOCUMENTS

| | | | |
|---|---|---|---|
| 6,037,793 A | 3/2000 | Miyazawa et al. | |
| 6,552,561 B2* | 4/2003 | Olsen | G05D 23/1934 |
| | | | 324/73.1 |
| 6,866,094 B2* | 3/2005 | Cousineau | F25B 41/20 |
| | | | 324/750.08 |
| 7,271,604 B2* | 9/2007 | Reitinger | G01R 31/2874 |
| | | | 324/754.03 |
| 7,492,176 B2* | 2/2009 | Chiba | G01R 31/2865 |
| | | | 324/750.28 |
| 9,519,009 B2* | 12/2016 | Murakami | G01R 31/2601 |
| 10,732,218 B2* | 8/2020 | McClanahan | G01R 31/2874 |
| 2002/0017916 A1 | 2/2002 | Costello et al. | |
| 2004/0227536 A1 | 11/2004 | Sugiyama et al. | |
| 2005/0287685 A1 | 12/2005 | McFadden | |
| 2009/0102499 A1 | 4/2009 | Segawa et al. | |
| 2010/0193501 A1 | 8/2010 | Zucker et al. | |
| 2016/0093519 A1 | 3/2016 | Higashi et al. | |

* cited by examiner

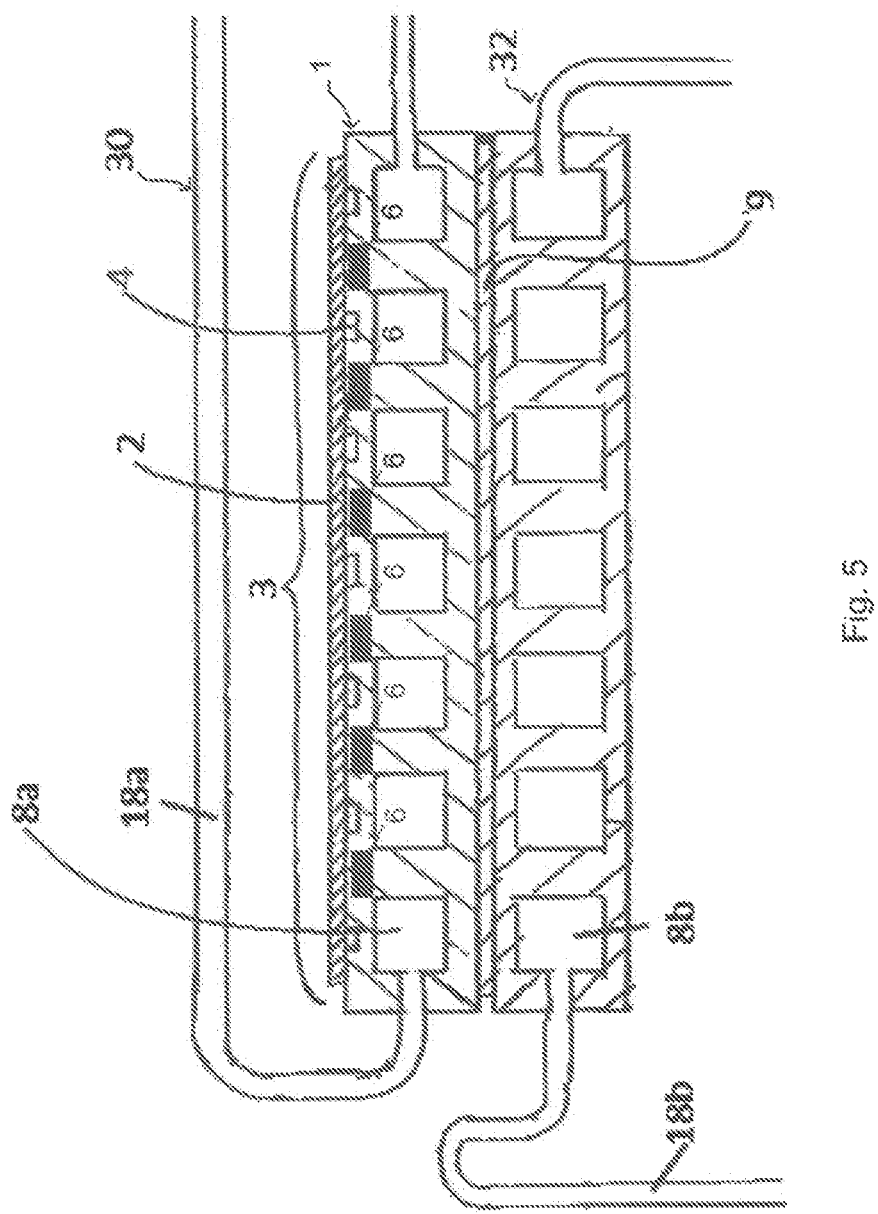

METHOD FOR OPEN-LOOP OR CLOSED-LOOP CONTROL OF THE TEMPERATURE OF A CHUCK FOR A WAFER, TEMPERATURE ADJUSTMENT DEVICE, AND WAFER TESTING SYSTEM

BACKGROUND

Related Art Chucks are used e.g. in the semiconductor industry, in particular in microelectronics and microsystem technology, for providing wafers, for example for examining geometric parameters of a wafer. Also, structures located on the wafer (electrical components such as diodes, transistors, integrated circuits, etc.) can be contacted with the aid of a test means (prober) and various functional tests can be carried out. Functional tests include e.g. applying a voltage and/or a current to the structures and measuring specific parameters. For such functional tests it is particularly advantageous for the wafer or the structures of the wafer to be tested to have a certain temperature at the beginning of the test. This has the particular advantage that influences interfering with the test can be reduced or substantially avoided. In addition, there is usually a change in the temperature of the structures or of the wafer due to the interaction with the test means (prober), in particular upon contacting the structures with the prober and due to the current flows during the performance of the functional tests. It is therefore advantageous to continuously temperature-control the structures or the wafer or to control or regulate the temperature thereof, so that preferably substantially identical test conditions prevail for the functional tests. The temperature range in which functional tests are carried out is usually in the range from about −75° C. to about 400° C.

A plurality of temperature sensors and temperature control elements can be used for controlling or regulating the temperature and can be controlled or regulated in different ways. A chuck often is equipped with a plurality of temperature sensors to obtain a measurement of the temperatures of different areas of the chuck or wafer. In addition, plural temperature control elements usually are provided for heating and/or cooling the chuck or wafer. Here, the temperature is monitored in a plurality of areas of the chuck or wafer and, in the case of a deviation from a target temperature, the temperature control element(s) in this area is/are controlled accordingly so that the temperature in these areas of the wafer or chuck is always substantially identical and substantially corresponds to the target temperature.

However, a regulation or control as described in the process is expensive to implement. In addition, areas of the chuck or wafer in which no functional tests are carried out are continuously temperature-controlled, but the temperature in these areas substantially has little or no influence on the functional tests.

It is therefore an object of the present invention to provide a method for temperature control or regulation as well as a temperature control device and a wafer test system for simplified, advantageous temperature control of a chuck or wafer.

SUMMARY OF THE INVENTION

One aspect of the invention relates to a method for controlling or regulating the temperature of a chuck for a wafer, comprising the steps of: detecting the position of a test means for testing a wafer; determining the respective spatial distances between the test means and a plurality of temperature-measuring means for measuring a temperature of the chuck or a wafer mounted or clamped by the chuck; selecting at least one temperature-measuring means among the plurality of temperature-measuring means as a reference temperature-measuring means; and controlling or regulating the temperature of the chuck based on the temperature(s) of the chuck or wafer measured by the selected reference temperature-measuring means.

This method enables a simplified and advantageous temperature control of a chuck or wafer, since the temperature control of the entire chuck takes place substantially uniformly, for example by controlling all means for temperature control of the chuck. Thus, the method has low requirements in terms of process handling and/or the control or regulation electronics. In addition, there is no unnecessary heating and/or cooling of areas of the chuck or wafer that are insignificant for the functional tests carried out.

In some embodiments, a chuck has a platform for clamping a wafer, and a wafer may be mounted or clamped by the chuck e.g. by means of generating a magnetic field or a vacuum.

The chuck of some embodiments comprises a plurality of temperature-measuring means arranged in or on the chuck to measure a temperature of the chuck or wafer at preferably several different locations.

The wafer may be mounted or clamped by the chuck in such a way that a test means, for example a probe needle or a probe card, can contact different locations on a wafer surface and test structures located in the wafer or on a surface of the wafer. Plural probe needles or probe fingers may be aligned to contact contact surfaces of the structures to be tested and can examine the properties of the structure, e.g. by introducing a current or applying a voltage.

In some embodiments, the temperature of the chuck is controlled or regulated substantially uniformly, i.e. substantially in the same manner or consistently, such as by uniform control of one or more means for temperature control of the chuck, such as several electrothermal converters arranged in or on a chuck.

Selecting a temperature-measuring means as a reference temperature-measuring means may comprise selecting the temperature-measuring means that has the smallest spatial distance from the test means.

The temperature of the chuck, and furthermore of the wafer, may be controlled or regulated based on the measured temperature of an individual temperature-measuring means among the plurality of temperature-measuring means. Use may be made of the temperature-measuring means or the measured temperature of the temperature-measuring means that has the smallest spatial distance from the test means or is closest to the current position of the test means. Thus, advantageously, the temperature-measuring means that potentially detects or records a temperature change in the area of the wafer in which the structure to be tested is located most precisely and/or first in terms of time is selected for controlling or regulating the temperature of the chuck or the wafer as the reference temperature-measuring means.

If the determined spatial distances of two or more temperature-measuring means are within a certain tolerance T± and/or are substantially the same size, selecting the reference temperature-measuring means may comprise the step of: selecting the temperature-measuring means among the two or more temperature-measuring means that the has the greatest amount of temperature difference Tdiff and/or temperature change per time Tgrad; or selecting the two or more temperature-measuring means as reference temperature-measuring means. In accordance with this aspect of the disclosure, controlling or regulating the temperature of the chuck may be based on the mean or average of the temperatures measured by the reference temperature-measuring means. Here, the tolerance T± can correspond e.g. to an equivalent of preferably less than about 10 cm, more preferably less than about 1 cm, more preferably less than about 0.1 cm. Substantially the same size may correspond e.g. to a difference in the distances of less than about 10%, more preferably less than about 1%, more preferably than about 0.1%. The values can be selected according to the structural conditions, in particular the number and/or arrangement of the plurality of temperature-measuring means, and/or the desired behavior of the temperature control or regulation. Alternatively, two or more of the temperature-measuring means can be selected as reference temperature-measuring means, and the temperatures measured by the two or more reference temperature-measuring means and, for example, an average of the measured temperatures, can be used to regulate or control the temperature of the chuck.

Here, the temperature difference Tdiff corresponds to the amount of the difference between the measured temperature T(t) and:

a target temperature of the chuck or wafer Tsoll:

$T\text{diff}=|T(t)-T\text{soll}|$ or a previously measured temperature T(t–x) of the same temperature-measuring means:

$T\text{diff}=|T(t)-T(t-x)|$ or an average temperature of a plurality of temperature-measuring means Tavg:

$T\text{diff}=|T(t)-T\text{avg}|=|T(t)-(T1+T2+T3+\ldots+TX)/X|$.

Preferably, the temperature change per time Tgrad is compared within a certain time period t1:

$T\text{grad}=|(T(x)-T(x+t1))/t1|$.

In this way, that temperature-measuring means that detects the greatest temperature drop or the greatest temperature increase within a time period t1 can be selected as the reference temperature-measuring means. The time period t1 is preferably less than about 5 seconds, more preferably less than about 1 second.

In some embodiments, the spatial distance between the test means and a temperature-measuring means is determined based on vector coordinates. Here, the positions of the test means and the temperature-measuring means are preferably projected into a coordinate system and the connection vectors and further their amounts (lengths) are calculated to determine the respective distances between the test means and the temperature-measuring means. To determine the distance, 2D and/or 3D coordinates of the test means and the temperature-measuring means can be used. The 2D coordinates of the test means and/or the temperature-measuring means preferably relate to a plane parallel to the wafer surface. The determination of the distances based on vector coordinates is described in more detail in the detailed description of the figures.

A further aspect of the invention relates to a temperature control device for temperature control of a chuck and/or of a wafer positioned or clamped by the chuck. The temperature control device has a first communication interface for communicating with a chuck, and the first communication interface is suitable for transmitting electrical signals. The temperature control device further has a control unit in connection with the first communication interface. The control unit may be operative for: receiving electrical signals from a plurality of temperature-measuring means for measuring the temperature of the chuck or wafer; selecting one of the temperature-measuring means as a reference temperature-measuring means; and controlling or regulating the temperature of the chuck based on the temperature(s) of the chuck or wafer measured by the selected reference temperature-measuring means.

The temperature control device may be configured for selecting the temperature-measuring means that has the smallest spatial distance from a test means for testing the wafer as the reference temperature-measuring means.

In some embodiments, the control unit of the temperature control device is suitable for selecting the temperature-measuring means that has the greatest amount of a temperature difference Tdiff and/or temperature change per time Tgrad as the reference temperature-measuring means, provided that the determined spatial distances of two or more temperature-measuring means are within a certain tolerance T± and/or are substantially the same size.

The temperature control device of some embodiments further comprises: a second communication interface for supplying and/or draining a temperature control medium into or out of the chuck for controlling the temperature of the chuck; and/or a third communication interface for communicating with at least one electrothermal converter for controlling the temperature of the chuck.

A further aspect relates to a wafer test system for testing a wafer. The wafer test system in accordance with this aspect of the disclosure comprises a chuck for providing or clamping and temperature control of a wafer. Temperature-measuring means are provided for measuring a temperature of the chuck and/or of a wafer mounted or clamped by the chuck. The wafer test system further has: at least one test means for testing the wafer; a position detection means for detecting the position of the test means in relation to the chuck or wafer; and a temperature control device described in the process.

In the following detailed description, individual embodiments for solving the object will be described by way of example with reference to the figures. Some of the individual embodiments described have features that are not absolutely necessary in order to carry out the claimed subject matter, but which provide desired properties in certain applications. Thus, embodiments that do not include all the features of the embodiments described below shall also be considered to be disclosed as falling under the technical teaching described. Furthermore, in order to avoid unnecessary repetition, certain features will only be mentioned in relation to individual embodiments described below. It should be noted that the individual embodiments shall therefore not only be viewed individually, but also viewed together. On the basis of this overview, the person skilled in the art will recognize that individual embodiments can also be modified by including individual or multiple features of other embodiments. It is pointed out that a systematic combination of the individual embodiments with one or more features described in relation to other embodiments can be desirable and practical and shall therefore be considered, and shall also be regarded as encompassed by the description.

BRIEF DESCRIPTION OF THE DRAWINGS

FIG. 5 shows an alternative exemplary embodiment of a chuck comprising two separate temperature control circuits for different temperature control media.

DETAILED DESCRIPTION

Figure 1:
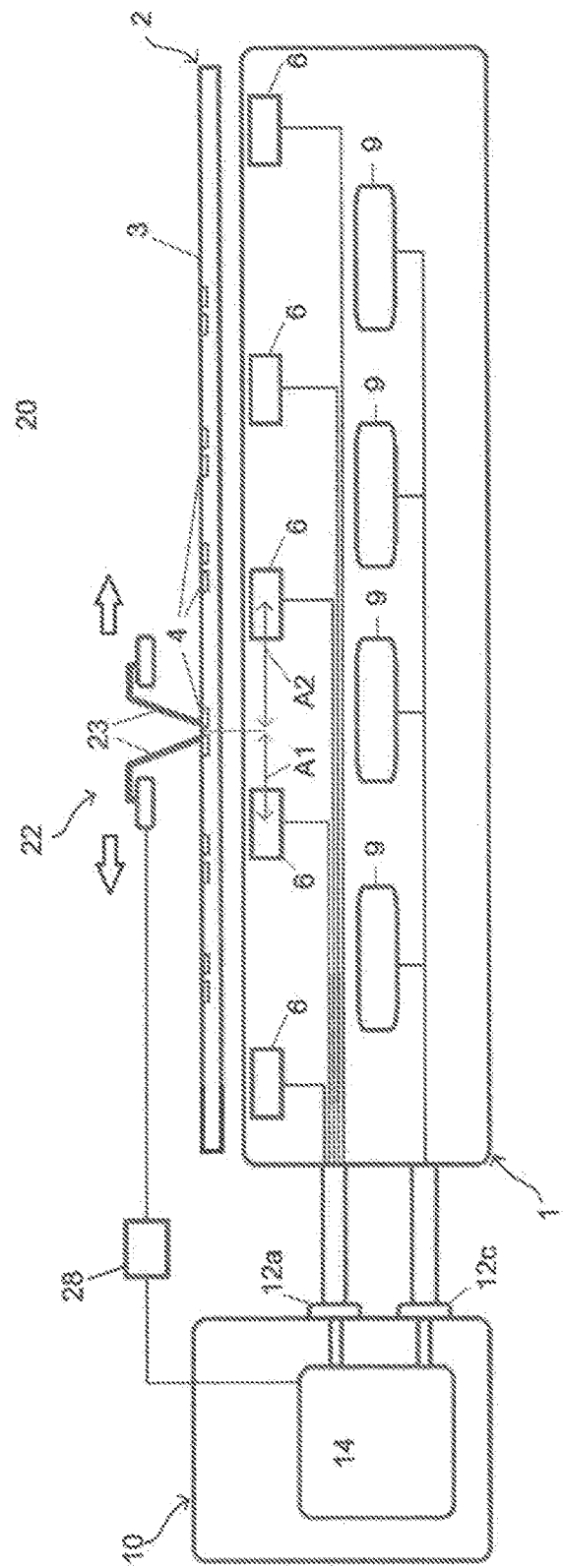
FIG. 1 shows an exemplary embodiment of a wafer test system with a wafer mounted on a chuck, a test means for testing the wafer, and a temperature control device that enables a temperature control of the chuck by means of a plurality of electrothermal converters.

FIG. 1 is a sectional view of a wafer test system 20 according to an exemplary embodiment. The illustrated wafer test system 20 comprises a chuck 1 or a holding or clamping device that mounts or clamps a wafer 2. The wafer 2 preferably is mounted parallel to a substantially flat surface of the chuck 1 by means of an applied magnetic field. Alternatively, the chuck 1 can have a plurality of suction grooves (not shown) via which the wafer can be sucked by means of negative pressure and thus clamped or positioned by the chuck 1. As a result of the suction, the wafer 2 is pressed against the chuck 1 or arranged on it so that a good heat transfer coefficient between the chuck 1 and the wafer 2 is ensured. The chuck 1 preferably comprises a ceramic body, for example comprising aluminum oxide or aluminum nitride, and more preferably an electrically conductive shielding layer on the surface of the chuck 1 oriented toward the wafer 2. The wafer 2 is preferably in substantially surface contact with the shielding layer of the chuck 2. The wafer 2 preferably further has a wafer surface 3 comprising one or more structures 4 to be tested. The structures 4 to be tested are e.g. integrated circuits or electrical components (diode, transistor, etc.). The wafer 2 can have a different number and/or arrangement of structures 4 to be tested, depending on the size of the wafer surface 3 and the structures 4 to be tested.

In this context, reference is made to particularly preferred embodiments of the chuck as described in patent specifications US 2008/302513 and DE 20 2005 014 918 U1, the contents of which are hereby incorporated into the present disclosure by reference.

The illustrated embodiment of the wafer test system 10 further comprises at least one test means 22 with which a structure 4 of the wafer 2 to be tested can be tested. A suitable test means 22 has one or more probe needles 23 each of which can contact a contact point of a structure 4 to be tested. The properties of the structures 4 can be examined or tested in this way, for example by introducing a current or applying a voltage and/or measuring voltages/currents by means of the probe needles 23. The control of the test means 22, in particular the alignment of the test means 22 in relation to the wafer 2 or to the structures 4, takes place e.g. by a (preferably separate) control device. In the embodiment of the wafer test system 20 shown illustrated herein, the test means 22 is moved over the wafer 2 and aligned on the wafer surface 3 in accordance with the positions of the structures 4 to be tested. In addition, a position detection means 28 for detecting and/or checking the position of the test means 22 preferably is provided. The position detection means 28 of certain embodiments receives the position of the test means 22 e.g. from an actuating or positioning device for moving the test means 22. Alternatively and/or in addition, the position detection means 28 can detect the position of the test means 22 by means of sensors (e.g. infrared sensors, resistive sensors and/or magnetic sensors). The position of the test means 22 is detected or determined with the aid of the position detection means 28, preferably in relation to a reference element/point of the wafer 2 and/or the chuck 1 (e.g. wafer surface 3, structure 4 of the wafer, temperature detection means 6 of the chuck).

Figure 2:
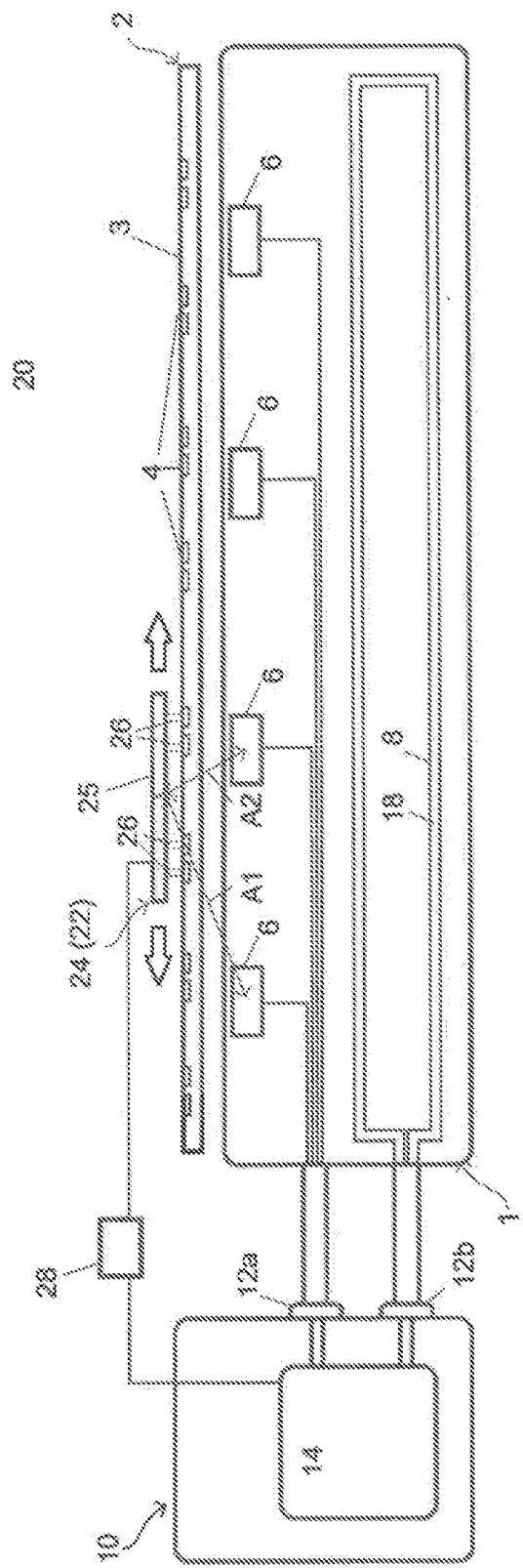
FIG. 2 shows an alternative exemplary embodiment of a wafer test system comprising a chuck, a test means for testing the wafer, and a temperature control device that controls the temperature of the chuck by introducing a temperature control medium into the chuck.

As an alternative to the test means 22 described in the process, a test means 22 suitable for testing the wafer 2 can have a so-called probe card 24. The probe card 24 may comprise a circuit board 25 with contact elements 26 that can be contacted with contact points of structures 4 to be tested. The probe card 24 has the particular advantage of enabling plural structures 4 to be tested substantially simultaneously or immediately one after the other without realigning the test means 22. FIG. 2 shows a further embodiment of a wafer test system 20 with such a probe card 24 as a test means 22 for testing the structures 4 on the wafer 2.

In the embodiment shown, the chuck 1 comprises a plurality of temperature-measuring means 6 suitable for measuring a temperature of the wafer 2 or the temperature of the chuck 1 in a range close to or substantially adjacent to the wafer 2 (for example temperature sensors: PT100, NTC, PTC, etc.). In the embodiment shown, plural (preferably 5) temperature-measuring means 6 are provided next to one another at substantially regular intervals and in a plane substantially parallel to the wafer surface 3. The temperature-measuring means 6 are arranged in the chuck 1 near the surface of the chuck 1 on which the wafer 2 is clamped/mounted, so that the temperature of the wafer 2 advantageously can be transmitted to the chuck 1. The chuck 1 according to the exemplary embodiment shown preferably has one or more electrothermal converters 9 (for example electrical heating elements and/or Peltier elements) to enable controlling the temperature of the chuck 1 and, subsequently, of the wafer 2. Preferably, the chuck 1 has more than 5, more preferably more than 10 electrothermal converters 9 preferably arranged in the chuck 1 in a substantially evenly distributed manner, so that the temperature of the chuck 1 can be advantageously controlled, in particular cooled and/or heated.

As an alternative to the exemplary embodiment of a chuck 1 described in the process, other means or features for temperature control or regulation of the chuck 1 can also be mounted. A further embodiment of a chuck 1 has a line 8 that is suitable for having a temperature control medium 18 flow therethrough, in particular temperature-controlled air and/or temperature-controlled liquid. The medium line 8 of the chuck 1 of this embodiment is designed in such a way that a large part of the chuck 1 can be temperature controlled substantially uniformly by means of the temperature control medium 18 flowing through the medium line 8. The medium line 8 of some embodiments has a substantially meander-shaped course in the interior of the chuck 1 at least in part. FIG. 2 shows a further exemplary embodiment of a wafer test system 20 with a chuck 1, the temperature of which can be controlled or regulated by a temperature control medium 18.

The embodiment of a wafer test system 20 shown in FIG. 1 further comprises a temperature control device 10 for controlling or regulating the temperature control of the chuck 1 or wafer 2. The temperature control device 10 of this embodiment comprises means for communicating with the chuck 1, for example in the form of one or more communication interfaces 12 via which the temperature control device 12 can be connected to the chuck 1. The temperature control device 12 of this embodiment has at least one first communication interface 12a that is particularly suitable for transmitting electrical signals, in particular electrical signals from one or more temperature-measuring means 6 to the temperature control device 12. Further, the temperature control device 12 according to the exemplary embodiment has at least one further communication interface 12c that enables communication with the one or more electrothermal converters 9 of the chuck 1, in particular control of the electrothermal converters 9. Alternatively and/or in addition, a single communication interface 12 for communicating with the temperature measuring means 6 and the electrothermal converters 9 can be provided.

The exemplary temperature control device 12 shown further has a control unit 14 (e.g. (micro) controller, FPGA, etc.) that is connected to the one or more communication interfaces 12 and can communicate with the chuck 1 via these interfaces. In particular, the control unit 14 is suitable for receiving, processing and/or evaluating the signals from the temperature-measuring means/temperature sensors 6 of the chuck 1. Moreover, the exemplary embodiment of the control unit 14 of FIG. 1 is suitable for influencing or controlling/regulating the temperature of the chuck 1 or the wafer 2. In particular, the control unit 14 is suitable for controlling the electrothermal converters 9 of the chuck 1 to increase, decrease and/or keep substantially constant the temperature of the chuck 1. Further, the control unit 14 may be designed to obtain the position of the test means 22 from the position detection means 28. Alternatively and/or in addition, the control unit 14 of some embodiments is suitable for controlling or regulating a supply and/or drain-off of a temperature control medium 18 for temperature control of the chuck 1 and/or the temperature of the temperature control medium 18. A detailed description of this will be given with reference to FIG. 2.

Moreover, the embodiment of the control unit 14 shown in FIG. 1 enables the temperature control device 10 to carry out a method for temperature control or regulation of a chuck 1 and/or of a wafer 2 mounted or clamped by a chuck 1. The method includes determining the respective spatial distances between the test means 22 and a plurality of temperature-measuring means 6 for measuring a temperature of the chuck 1 or of a wafer 2 clamped by the chuck 1.

The control unit 14 in the embodiment shown can determine the respective spatial distance between the test means 22 and the plurality of temperature-measuring means 6 of the chuck 1.

An exemplary method suitable for this step comprises defining the positions of the test means 22 and of the temperature-measuring means 6 in a (preferably Cartesian) coordinate system. The position of the test means 22 may be approximated to a point or a substantially punctiform, infinitesimally small area, preferably in a plane substantially parallel to the wafer surface 3. This point may substantially correspond to a geometric center of gravity of the test means 22 or its projection onto the plane defined by the temperature-measuring means 6 of the chuck 1. Further, a reference point of this embodiment is determined as the coordinate origin or pole/zero point of a two-dimensional coordinate system, which is preferably located on the plane of the plurality of temperature-measuring means 6. Further, the positions of the individual temperature-measuring means 6, as well as the test means 22, are approximated to a substantially punctiform, infinitesimally small area (preferably corresponding to the geometric center of gravity) and assigned to a coordinate in the coordinate system. Moreover, the control unit 14 determines the distances of the individual temperature-measuring means 6 from the test means 22. This distance calculation may be carried out by calculating the length (amount) of the connection vectors between the respective coordinates of the test means 22 and the temperature-measuring means 6.

The method described in the process for determining the spatial distances between the test means 22 and the individual temperature-measuring means 6 represents only one embodiment. For example, the positions of the test means 22 or of the temperature-measuring means 6 can also be assigned to coordinates in a three-dimensional coordinate system (without projection to a certain plane—see FIG. 2). In addition, any alternative methods for determining the distances of the test means 22 from the temperature-measuring means 6 can be used.

Furthermore, the exemplary method for temperature control or regulation of a chuck 1 or of a wafer 2 clamped by the chuck 1 comprises the step of:
  selecting a temperature-measuring means 6 from the plurality of temperature-measuring means 6 as a reference temperature-measuring means; and
  selecting the temperature-measuring means 6 having the smallest spatial distance from the test means 22.

To this end, the control unit 14 of some embodiments compares the determined spatial distances $A_i$ of the individual temperature-measuring means 6 from the test means 22 and selects the temperature-measuring means 6 with the smallest distance $A_i$ as the reference temperature-measuring means. If two or more temperature-measuring means 6 have substantially the same distance or distances with a difference less than a certain tolerance value $T\pm$ (preferably less than about 1 cm, more preferably less than about 0.1 cm), a (further) selection among the temperature-measuring means 6 concerned takes place by choosing the temperature-measuring means 6 among the two or more temperature-measuring means 6 (the determined spatial distances of which from the test means 22 are within a certain tolerance $T\pm$ and/or are substantially the same) that has the greatest amount of temperature difference $T_{diff}$ and/or temperature change per time $T_{grad}$.

Alternatively, two or more of the temperature-measuring means 6 can also be selected as reference temperature-measuring means and, for example, an average of the temperatures measured by the reference temperature-measuring means can be used as the reference temperature for controlling the temperature of the chuck 1.

If two or more temperature-measuring means 6 are at a substantially identical distance from the test means 22, the temperatures or temperature profiles measured by the temperature-measuring means 6 concerned or having a substantially identical distance from the test means are further compared. For example:
  the individual temperature difference $T_{diff}$ of a temperature-measuring means 6 corresponds to the amount of the difference between a temperature measured by the temperature-measuring means 6 at the time t $T(t)$ and:
  a target temperature of the chuck or of the wafer $T_{soll}$:

$$T_{diff} = |T(t) - T_{soll}|$$

or
  a previously measured temperature $T(t-x)$ of the same temperature-measuring means 6:

$$T_{diff} = |T(t) - T(t-x)|$$

Figure 3:
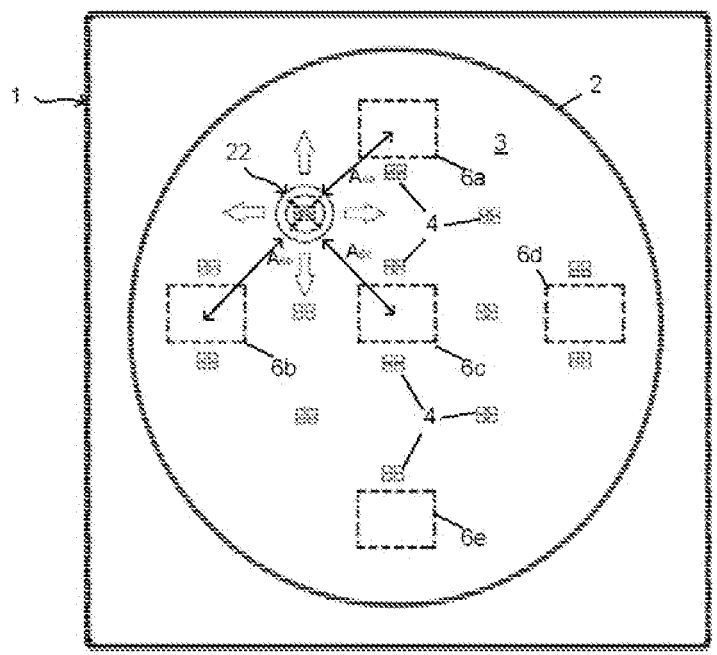
FIG. 3 shows a plan view of a chuck and a mounted wafer with a plurality of structures to be examined as well as a test means for testing the plurality of structures to be examined and a plurality of temperature-measuring means.
Figure 4:
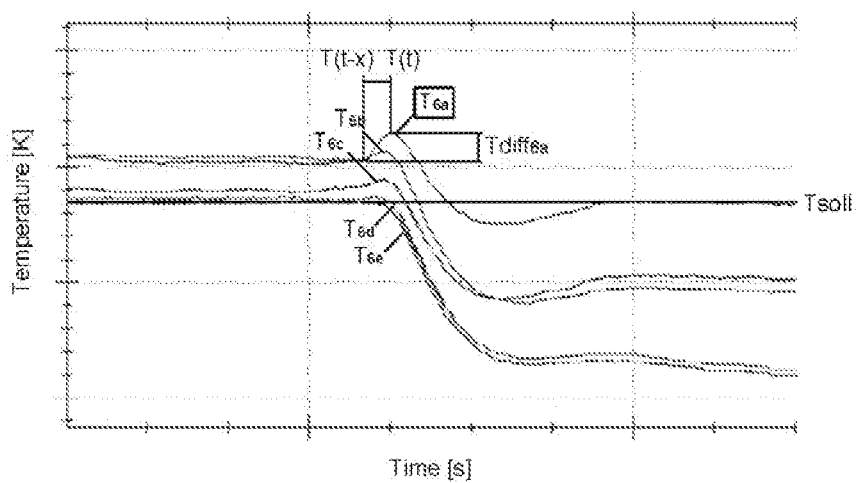
FIG. 4 shows an exemplary profile of the temperature of a chuck or wafer measured by a plurality of temperature-measuring means.

(a selection process based on this temperature difference is shown as an example in FIGS. 3 and 4)

or an average temperature of a plurality X of temperature-measuring means 6 (preferably all temperature-measuring means 6 of the chuck 1) Tavg:

$$T\text{diff} = |T(t) - T\text{avg}| = |T(t) - (T1 + T2 + T3 + \ldots + TX)/X|.$$

The temperature change per time Tgrad within a certain period of time t1 may correspond to the amount of a change in the temperature measured by a temperature-measuring means 6 over a duration or a period of time t1:

$$T\text{grad} = |T(x) - T(x+t1)|.$$

As a result, the temperature-measuring means 6 that detects the greatest temperature loss or the greatest temperature increase within a time period t1 subsequently is selected as the reference temperature-measuring means. The time period t1, over which the temperature profile is determined, is preferably less than about 5 seconds, more preferably less than about 1 second, more preferably less than about 0.1 seconds.

The parameters described in the process for (further) selecting one of the temperature-measuring means 6 from the temperature-measuring means 6 concerned can be used both alone and in any combination, possibly with different weighting, for the step of selecting the reference temperature-measuring means. The same applies to the determined distance of the temperature-measuring means concerned. In addition, further alternative parameters can also be used for selecting the reference temperature-measuring means.

Furthermore, the exemplary method for temperature control or regulation of a chuck 1 or of a wafer 2 clamped by a chuck 1 may further comprise the step of: controlling or regulating the temperature of the chuck 1 based on the temperature of the chuck 1 or the wafer 2 measured by the reference temperature-measuring means selected.

The temperature of the entire chuck 1, i.e. preferably all means for temperature control of the chuck 1 (e.g. electrothermal converters, temperature control medium/medium line), is controlled substantially uniformly/identically, so that the temperature of the chuck 1 is controlled substantially uniformly. For controlling or regulating the temperature of the chuck 1, preferably only the measured temperature of the selected reference temperature-measuring means is used. In some embodiments, the temperature measured by the reference temperature-measuring means is compared with a specified target temperature of the chuck 1 or of the wafer 2 and, for example, is substantially adapted to the target temperature of the chuck 1 or of the wafer 2 by correspondingly controlling the temperature control means (e.g. electrothermal converter 9) (see also FIG. 4). As a result, it is possible for different areas of the chuck 1, which influence the temperature of the wafer 2, to have different temperatures.

FIG. 2 is a sectional view of a wafer test system 20 according to a further embodiment (similar to the embodiment in FIG. 1). The wafer test system 20 shown in FIG. 2 comprises a chuck 1 that clamps a wafer 2 by means of a magnetic field or application of a negative pressure. The chuck 1, like the chuck 1 in FIG. 1, has plural temperature-measuring means 6 (e.g. PT100, NTC, PTC) for measuring the temperature of the chuck 1 or of the wafer 2. These temperature measuring means 6 are connected to a control unit 14 via a first communication interface 12a. The wafer test system 20, like the system in FIG. 1, is suitable for carrying out the method described in the process for controlling the temperature of a chuck 1 or of a wafer 2.

As an alternative to the wafer test system 20 shown in FIG. 1, however, in the system shown in FIG. 2, a so-called probe card 24 is provided as a test means 22 for testing the wafer 2 or the structures 4 on the wafer 2. The probe card 24 of this embodiment comprises a circuit board 25 with contact elements 26 arranged in such a way that they can be brought into contact with contact points of several structures 4 to be tested on the wafer 2. Thus, by aligning or positioning the test means 22 or the probe card 24 once, several structures can advantageously be tested substantially simultaneously and/or sequentially, which enables the test method to be accelerated.

What is also shown is a different determination of the respective spatial distances between the temperature-measuring means 6 and the test means 22 or the probe card 24. Unlike in FIG. 1, the position of the probe card 24 is not projected onto a plane formed by the positions of the temperature-measuring means 6, but is determined according to an alternative method. This exemplary method assigns a coordinate in a three-dimensional (preferably Cartesian) coordinate system to the test means 22 (probe card 24) and the temperature-measuring means 6 and determines the length or the amount of the connection vectors in three-dimensional space. As described with regard to FIG. 1, the positions of the individual temperature-measuring means 6 and of the test means 22 are approximated to a substantially punctiform, infinitesimally small area (preferably corresponding to the respective geometric center of gravity). The distances Ai correspond to the length (amount) of the connection vectors between the coordinates of the temperature-measuring means 6 and the test means 22.

Also different to the embodiment shown in FIG. 1, the means for temperature control or controlling or regulating the temperature of the chuck 1 comprises a temperature control medium 18 and a medium line 8, arranged in the chuck 8, for conducting the temperature control medium 18. For example, the temperature control medium comprises temperature-controlled air and/or temperature-controlled liquid and flows through the medium line 8 of the chuck in order to achieve temperature control (increasing/lowering/maintaining a temperature of the chuck 1). The medium line 8 of the chuck 1 is designed to be substantially meander-shaped, at least in part, so that an advantageous temperature control of the chuck 1 can be achieved by means of the temperature control medium 18. According to the preferred embodiment shown, the temperature control device 10 has a corresponding communication interface 12b that is suitable e.g. for supplying and/or draining the temperature control medium into the chuck 1 or out of the chuck 1. A correspondingly configured control unit 14 is suitable for influencing or adapting the flow parameters, the temperature and/or the composition of the temperature control medium 18 as required. Various alcohols such as amyl alcohol (pentanol) and methanol, but also heptane, are particularly suitable as the temperature control medium. A thermal oil based on silicone oil is more suitable. A temperature control fluid containing perfluorinated polyether (e.g. available under the trade name Galden HT from Solvay Solexis SpA), poly(oxyperfluoro-n-alkylene) (e.g. available under the trade name Galden ZT from Solvay Solexis SpA) and/or a mixture of triethoxyalkylsilanes (for example available under the trade name DW-Therm from DWS Synthesetechnik) is preferably used. However, other substances known to the person skilled in the art can also be used. Further, the chuck 1 can have several (independent) medium lines 8 that are suitable for temperature control of a large part of the chuck 1, which can furthermore preferably be controlled substantially uniformly, so that a substantially uniform temperature control of the entire chuck 1 or all temperature control elements of the chuck can be used.

FIG. 3 is a top view of a chuck 1 with a mounted or clamped wafer 2 that has a substantially circular wafer surface 3. The wafer has a plurality (preferably between 1 and about 1000; more preferably between about 5 and about 200; more preferably between about 10 and about 100; for example 14, as shown in FIG. 3) of structures 4 to be tested. The structures are arranged in a substantially uniform pattern in or on the wafer 2 (wafer surface 3). In the exemplary embodiment shown, the chuck 1 has a plurality (preferably between about 3 and about 20; for example 5, as shown in FIG. 3) of temperature-measuring means 6a, 6b, 6c, 6d, 6e, preferably PT-100 temperature sensors that are preferably located below the wafer 2. Alternatively and/or in addition, other temperature sensors such as HTCs and/or NTCs can be provided to measure the temperature of the chuck 1 or of the wafer 2.

The temperature-measuring means 6a-6e preferably are arranged according to a pattern, as shown, and more preferably distributed substantially uniformly over the wafer surface 3. FIG. 3 also shows a test means 22 with a plurality (preferably 4) of probe needles 23 (not identified) that are suitable for contacting contact surfaces of the structures 4 to be tested in order to test them.

The test means 22 shown in FIG. 3 is located substantially above one of the plurality of the structures 4 to be tested, with its probe needles 23 respectively contacting a contact surface of the structure 4. In this state, the test means 22 has a position (preferably approximated, substantially punctiform and substantially corresponding to the geometric center of gravity) whose distance from the (preferably approximated, substantially punctiform and substantially corresponding to the geometric center of gravity) positions of the temperature-measuring means 6a, 6b and 6c is substantially identical (or wherein the distances between the test means 22 and one of the temperature-measuring means A6a, A6b or A6c each have a difference within a specified tolerance value T±). If such a case occurs when using the method described in the process for temperature control or regulation of the chuck 1, the reference temperature-measuring means preferably is selected among the temperature-measuring means 6a, 6b and 6c taking into account the temperature difference Tdiff and/or the temperature gradient Tgrad of the temperature-measuring means 6a, 6b and 6c.

FIG. 4 shows an exemplary temperature profile for the arrangement shown in FIG. 3 and described in the process. The profiles of the temperatures T6a, T6b, T6c, T6d and T6e measured by the temperature-measuring means 6a-6e are shown here. As described in the process, the reference temperature-measuring means on which the regulation or control of the temperature of the chuck 1 or of the wafer 2 is based is selected among the temperature-measuring means 6a, 6b and 6c. To this end, in the present example, the temperature differences Tdiff of the temperature T(t) of the temperature-measuring means 6a-6c measured at the time t are compared with the temperatures of the respective temperature-measuring means 6a-6c measured at the time tx (i.e. a period of duration x before the time t):

$$T\text{diff}6a = |T6a(t) - T6a(t-x)|$$

$$T\text{diff}6b = |T6b(t) - T6b(t-x)|$$

$$T\text{diff}6c = |T6c(t) - T6c(t-x)|$$

In FIG. 3, the temperature difference Tdiff6a of the temperature-measuring means 6a is shown as an example or representative, which in this exemplary scenario also corresponds to the greatest temperature difference of the temperature-measuring means 6a-6c.

The temperature differences Tdiff6a, Tdiff6b and Tdiff6c are compared with one another and the temperature difference with the highest value is determined. According to the exemplary method, the temperature-measuring means 6 associated with the temperature difference with the highest value is selected as the reference temperature-measuring means. Consequently, in the present exemplary method, the temperature-measuring means 6a is selected as the reference temperature-measuring means and is used to control the temperature of the chuck 1 or of the wafer 2.

Further preferably, the temperature control (control or regulation of the temperature) is carried out by substantially adjusting the temperature measured by the temperature-measuring means 6a. As can be seen in FIG. 4, the temperature control influences each of the plurality of temperature-measuring means 6 and thus preferably substantially all or at least a large part of the areas of the chuck 1. In the present example, the temperature-measuring means 6b-6e measure a value (clearly) below the target temperature of the wafer 1 or of the chuck 1.

The method explained with regard to FIGS. 3 and 4 is only an exemplary embodiment of the method for temperature control of a chuck or of a wafer. In particular, the parameters used to select the reference temperature-measuring means can be varied depending on the requirements and/or desire. Here, for example, a temperature gradient of the temperature-measuring means can be selected or used as a determining parameter. The measured temperatures of two or more temperature-measuring means 6 can also be used as a reference value for the temperature control, for example by averaging the measured temperatures. The method of temperature control can also take place in an alternative manner, for example by substantially halving the difference between the temperature of the reference temperature-measuring means and the target temperature of the chuck 1 or of the wafer 2.

FIG. 5 shows a further embodiment of a chuck 1. A temperature control of the chuck 1 is made possible by different temperature control media 18a, 18b in a first temperature control circuit 30 and a second temperature control circuit 32. The two temperature control circuits 30, 32 each have a medium line 8a, 8b that extends at least in certain areas and substantially in a meandering manner. This exemplary embodiment enables advantageous temperature control of the chuck 1, since different temperature control media 18 can be used for temperature control in different temperature ranges. For example, a first temperature control medium 18a is used for a first temperature range, for example for a range between about −75° C. and about 100° C., and a second temperature control medium 18b is used for a second temperature range, for example between about 50° C. to about 400° C. Various alcohols such as amyl alcohol (pentanol) and methanol, but also heptane, are particularly suitable as the temperature control medium 18. A thermal oil based on silicone oil is more suitably used. A temperature control fluid containing perfluorinated polyether (e.g. available under the trade name Galden HT from Solvay Solexis SpA), poly(oxyperfluoro-n-alkylene) (e.g. available under the trade name Galden ZT from Solvay Solexis SpA) and/or a mixture of triethoxyalkylsilanes (for example available under the trade name DW-Therm from DWS Synthesetechnik) is preferably used. However, other substances known to the person skilled in the art can also be used.

Furthermore, the chuck 1 of FIG. 5 preferably has one or more electrothermal converters 9 to enable a further advantageous temperature control of the chuck 1. The one or more electrothermal converters 9 are particularly suitable for temperature control that can be adjusted precisely and quickly in a comparatively low temperature range of about +−50° C.

In this context, reference is made to the preferred embodiment of a chuck particularly suitable for this purpose, described in U.S. Pat. No. 9,202,729, the content of which is hereby incorporated into the present disclosure by reference.

LIST OF REFERENCE NUMERALS

- 1 chuck
- 2 wafer
- 3 wafer surface
- 4 structure to be tested
- 6 temperature-measuring device
- 8 medium line
- 9 electrothermal converter
- 10 temperature control device
- 12 communication interface
- 14 control unit
- 18 temperature control medium
- 20 wafer test system
- 22 test means
- 23 probe needle
- 24 probe card
- 25 circuit board
- 26 contact element
- 28 position detection means
- 30 first temperature control circuit
- 32 second temperature control circuit

The invention claimed is:

1. A method for controlling or regulating the temperature of a chuck (1) for a wafer (2), comprising the steps of:
   detecting a position of a test means (22) for testing a wafer (2);
   determining respective spatial distances between the test means (22) and a plurality of temperature-measuring means (6) for measuring a temperature of the chuck (1) or a wafer (2) mounted or clamped by the chuck (1);
   selecting at least one reference temperature-measuring means (6) from among the plurality of temperature-measuring means (6); and
   controlling or regulating the temperature of the chuck (1) based on the temperature(s) of the chuck (1) or wafer (2) measured by the at least one reference temperature-measuring means.

2. The method of claim 1, wherein the selecting of the at least one reference temperature-measuring means comprises:
   selecting the temperature-measuring means (6) that has a smallest spatial distance from the test means (22).

3. The method of claim 1, wherein if the determined spatial distances between the test means (22) and the plurality of the temperature-measuring means (6) are within a certain tolerance T± or are substantially the same, then selecting the at least one reference temperature measuring means (6) comprises:
   selecting the temperature-measuring means (6) from among the plurality of temperature-measuring means (6) that has a greatest amount of temperature difference Tdiff and/or temperature change per time Tgrad.

4. The method of claim 3, wherein the temperature difference Tdiff is an amount of a difference between a currently measured temperature T(t) and:
   a target temperature of the chuck (1) or wafer (2) Tsoll.

5. The method of claim 3, wherein the temperature change per time Tgrad is compared within a predetermined period of time t1.

6. The method of claim 3, wherein the temperature difference Tdiff is an amount of a difference between a currently measured temperature T(t) and a previously measured temperature T(t−x) of the same temperature-measuring means.

7. The method of claim 3, wherein the temperature difference Tdiff is an amount of a difference between a currently measured temperature T(t) and an average temperature of a plurality of the temperature-measuring means (6) Tavg.

8. The method of claim 1, wherein the spatial distance between the test means (22) and a temperature-measuring means (6) is determined based on vector coordinates.

9. The method of claim 1, wherein if the determined spatial distances between the test means (22) and the plurality of the temperature-measuring means (6) are within a certain tolerance T± or are substantially the same, then selecting the at least one reference temperature measuring means (6) comprises:
   selecting two or more of the plurality of temperature-measuring means (6) as the reference temperature-measuring means, with the control or regulation of the temperature of the chuck (1) being based on an average of the temperatures measured by the reference temperature-measuring means.

10. A temperature control device (10) for temperature control of a chuck (1) or of a wafer (2) mounted or clamped by the chuck (1), comprising:
    a first communication interface (12a) for communicating with a chuck (1), the first communication interface being suitable for transmitting electrical signals;
    a control unit (14) in connection with the first communication interface (12a) for:
      receiving electrical signals from a plurality of temperature-measuring means (6) for measuring the temperature of the chuck (1) or wafer (2);
      selecting at least one of the temperature-measuring means (6) as a reference temperature-measuring means;
      controlling or regulating the temperature of the chuck (1) based on the temperature(s) of the chuck (1) or wafer (2) measured by the selected reference temperature-measuring means.

11. The temperature control device of claim 10, wherein the control unit (14) is suitable for selecting the temperature-measuring means (6) that has a smallest spatial distance from a test means (22) for testing the wafer (2) as a reference temperature-measuring means.

12. The temperature control device (10) of claim 10, wherein the control unit (14) is suitable for selecting the temperature-measuring means (6) that has a greatest amount of a temperature difference Tdiff and/or temperature change per time Tgrad as a reference temperature-measuring means, provided that the determined spatial distances of two or more temperature-measuring means (6) are within a certain tolerance T±.

13. The temperature control device (10) of claim 10, further comprising:

a second communication interface (12*b*) for supplying and/or draining a temperature control medium (18) for controlling the temperature of the chuck (1) into or out of the chuck (1).

14. A wafer test system (20) for testing a wafer, comprising:
- a chuck (1) for mounting or clamping and temperature control of a wafer (2), comprising a plurality of temperature-measuring means (6) for measuring a temperature of the chuck (1) or of a wafer (2) mounted or clamped by the chuck (1);
- at least one test means (22) for testing the wafer (2);
- a position detection means (24) for detecting the position of the test means (22) in relation to the chuck (1) or wafer (2);
- the temperature control device (10) for temperature control of the chuck (1) and a wafer (2) mounted or clamped by the chuck (1) according to claim 10.

15. The temperature control device (10) of claim 13, further comprising:
- a third communication interface (12*c*) for communicating with at least one electrothermal converter (9) for controlling the temperature of the chuck (1).

16. The temperature control device (10) of claim 10, further comprising:
- a communication interface (12*c*) for communicating with at least one electrothermal converter (9) for controlling the temperature of the chuck (1).

* * * * *